(12) United States Patent
Dong et al.

(10) Patent No.: US 11,316,003 B2
(45) Date of Patent: Apr. 26, 2022

(54) ARRAY SUBSTRATE, DISPLAY DEVICE, AND METHOD FOR MANUFACTURING SAME

(71) Applicant: BOE Technology Group Co., Ltd., Beijing (CN)

(72) Inventors: Xue Dong, Beijing (CN); Guangcai Yuan, Beijing (CN); Haixu Li, Beijing (CN); Zhanfeng Cao, Beijing (CN); Ke Wang, Beijing (CN); Zhijun Lv, Beijing (CN); Fei Wang, Beijing (CN); Huijuan Wang, Beijing (CN); Zhiwei Liang, Beijing (CN); Xinhong Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/959,010

(22) PCT Filed: Feb. 25, 2020

(86) PCT No.: PCT/CN2020/076641
§ 371 (c)(1),
(2) Date: Jun. 29, 2020

(87) PCT Pub. No.: WO2020/211537
PCT Pub. Date: Oct. 22, 2020

(65) Prior Publication Data
US 2020/0335575 A1   Oct. 22, 2020

(51) Int. Cl.
*H01L 27/32* (2006.01)

(52) U.S. Cl.
CPC ...... *H01L 27/3276* (2013.01); *H01L 27/3262* (2013.01); *H01L 2227/323* (2013.01)

(58) Field of Classification Search
None
See application file for complete search history.

(56) References Cited

U.S. PATENT DOCUMENTS

| 9,252,375 B2 * | 2/2016 | Bibl ................ H01L 24/24 |
| 2014/0084482 A1 * | 3/2014 | Hu ................. H01L 24/29 |
| | | 257/774 |

(Continued)

FOREIGN PATENT DOCUMENTS

| CN | 104661953 A | 5/2015 |
| CN | 104838508 A | 8/2015 |

(Continued)

OTHER PUBLICATIONS

International search report of PCT application No. PCT/CN2020/076641 dated Apr. 24, 2020.

(Continued)

*Primary Examiner* — Telly D Green
(74) *Attorney, Agent, or Firm* — Fay Sharpe LLP

(57) ABSTRACT

Disclosed are an array substrate, and a display device, and a method for manufacturing the same. The array substrate includes: a base substrate, and a thin film transistor, a planarization pattern, a bonding pattern, and a conductive structure that are disposed on the base substrate. The thin film transistor, the planarization pattern, and the bonding pattern are laminated in a direction going distally from the base substrate. The planarization pattern is provided with a via and a groove, the conductive structure is disposed in the via, wherein the bonding pattern is conductive and is electrically connected to the thin film transistor by the conductive structure, an orthographic projection of the bonding pattern on the base substrate falls outside an orthographic projection of the groove on the base substrate, and the groove is configured to accommodate an adhesive.

19 Claims, 5 Drawing Sheets

(56) References Cited

U.S. PATENT DOCUMENTS

| | | | | |
|---|---|---|---|---|
| 2014/0267683 A1* | 9/2014 | Bibl | .................... | H01L 27/156 |
| | | | | 348/87 |
| 2017/0148773 A1* | 5/2017 | Sakariya | ............... | H01L 25/167 |
| 2017/0256522 A1* | 9/2017 | Cok | .................... | H01L 27/3255 |
| 2017/0301742 A1* | 10/2017 | Jeong | ................. | H01L 27/3248 |
| 2017/0352646 A1* | 12/2017 | Bower | ............... | H01L 25/0753 |
| 2018/0122837 A1* | 5/2018 | Kang | ................. | H01L 27/1248 |
| 2018/0190747 A1* | 7/2018 | Son | ....................... | G06F 3/1446 |
| 2019/0164946 A1* | 5/2019 | Fu | .......................... | H01L 33/52 |
| 2020/0091378 A1* | 3/2020 | Fan | ........................ | H01L 33/44 |

FOREIGN PATENT DOCUMENTS

| | | |
|---|---|---|
| CN | 106058010 A | 10/2016 |
| CN | 107302011 A | 10/2017 |
| CN | 107946415 A | 4/2018 |
| CN | 108022936 A | 5/2018 |
| CN | 108269823 A | 7/2018 |
| CN | 109119452 A | 1/2019 |
| CN | 109300931 A | 2/2019 |
| CN | 109326612 A | 2/2019 |
| CN | 109410775 A | 3/2019 |
| CN | 109616499 A | 4/2019 |
| CN | 109994533 A | 7/2019 |

OTHER PUBLICATIONS

First office action of Chinese application No. 201910308732.X dated Sep. 4, 2020.
Notification to grant patent right for invention of Chinese application No. 201910308732.X dated Oct. 15, 2020.

\* cited by examiner

ARRAY SUBSTRATE, DISPLAY DEVICE, AND METHOD FOR MANUFACTURING SAME

CROSS-REFERENCE TO RELATED APPLICATIONS

This application is a 371 of PCT Application No. PCT/CN2020/076641 filed on Feb. 25, 2020, which claims priority to Chinese Patent Application No. 201910308732.X, filed before the National Intellectual Property Administration, PRC on Wednesday, Apr. 17, 2019 and entitled "ARRAY SUBSTRATE, AND DISPLAY PANEL AND METHOD FOR MANUFACTURING SAME, AND DISPLAY DEVICE", the entire contents of which are incorporated herein by reference.

TECHNICAL FIELD

The present disclosure relates to an array substrate, a display device, and a method for manufacturing the same.

BACKGROUND

The micro light-emitting diode (micro LED) is a light-emitting diode of micron size. The micro LED may serve as a pixel on the display panel due to its small size. The display panel prepared by the micro LED may be called a micro LED display panel. Compared with the organic light-emitting diode (OLED) display panel, the micro LED display panel has a longer service life and a better visual angle comparing with the organic light-emitting diode (OLED) display panel. Therefore, the micro LED display technology has become a hot research subject in the field of display technologies at present.

SUMMARY

The present disclosure provides an array substrate, a display device, and a method for manufacturing the same. The technical solutions are as follows:

In one aspect, an array substrate is provided. The array substrate includes:

a base substrate, and a thin film transistor, a planarization pattern, a bonding pattern, and a conductive structure that are disposed on the base substrate;

the thin film transistor, the planarization patter, and the bonding pattern are laminated in a direction going distally from the base substrate;

wherein the planarization pattern is provided with a via and a groove, wherein the conductive structure is disposed in the via, the bonding pattern is conductive and is electrically connected to the thin film transistor by the conductive structure, an orthographic projection of the bonding pattern on the base substrate falls outside an orthographic projection of the groove on the base substrate, and the groove is configured to accommodate an adhesive.

Optionally, the planarization pattern includes a first sub-pattern and a second sub-pattern surrounding the first sub-pattern;

wherein the bonding pattern and the groove are both disposed on a side, distal from the base substrate, of the first sub-pattern, and the via is disposed between the first sub-pattern and the second sub-pattern.

Optionally, in a direction perpendicular to the base substrate, a thickness of the first sub-pattern is greater than a thickness of the second sub-pattern.

Optionally, in a direction perpendicular to the base substrate, the thickness of the first sub-pattern is in a range of 1.5 microns to 2.5 microns, the thickness of the second sub-pattern is in a range of 0.5 microns to 1.5 microns, and a depth of the groove is in a range of 0.2 microns to 0.8 microns.

Optionally, the bonding pattern is arranged to surround the groove.

Optionally, the bonding pattern includes a third sub-pattern and a fourth sub-pattern that are insulated from each other, the via includes a first via and a second via, and the conductive structure includes a first sub-structure disposed in the first via, and a second sub-structure disposed in the second via;

wherein the third sub-pattern is connected to a first power signal line in the thin film transistor by the first sub-structure, and the fourth sub-pattern is connected to a second power signal line in the thin film transistor by the second sub-pattern.

Optionally, the bonding pattern and the conductive structure are prepared using a same film layer.

Optionally, the thin film transistor is a thin film transistor with a top gate structure or a thin film transistor with a bottom gate structure.

Optionally, in a direction perpendicular to the base substrate, the thickness of the first sub-pattern is in a range of 1.5 microns to 2.5 microns, the thickness of the second sub-pattern is in a range of 0.5 microns to 1.5 microns, and a depth of the groove is in a range of 0.2 microns to 0.8 microns.

Optionally, the bonding pattern is arranged to surround the groove, the bonding pattern includes a third sub-pattern and a fourth sub-pattern that are insulated from each other, the via includes a first via and a second via, and the conductive structure includes a first sub-structure disposed in the first via, and a second sub-structure disposed in the second via;

wherein the third sub-pattern is connected to a first power signal line in the thin film transistor by the first sub-structure, and the fourth sub-pattern is connected to a second power signal line in the thin film transistor by the second sub-structure; and the bonding pattern and the conductive structure are prepared using a same film layer, and the thin film transistor is a thin film transistor with a top gate structure or a thin film transistor with a bottom gate structure.

In another aspect, a display device is provided. The display device includes: a light-emitting unit, an adhesive, and the array substrate as described above;

wherein the light-emitting unit is disposed on a side, distal from a base substrate, of a bonding pattern, the adhesive is disposed in a groove of a planarization pattern, and the light-emitting unit is fixedly connected to the bonding pattern by the adhesive.

Optionally, the light-emitting unit is a micro light-emitting diode, the micro light-emitting diode including a light-emitting body and an electrode pin protruding from the light-emitting body, the light-emitting body including a first electrode and a second electrode, and the electrode pin including a first pin connected to the first electrode and a second pin connected to the second electrode;

the bonding pattern is arranged to surround the groove and includes a third sub-pattern and a fourth sub-pattern that are insulated from each other, the via on the planarization pattern includes a first via and a second via, and the conductive structure includes a first sub-structure disposed in the first via, and a second sub-structure disposed in the second via, the third sub-pattern being connected to a first power supply signal line in the thin film transistor by the first sub-structure, and the fourth sub-pattern being connected to a second power signal line in the thin film transistor by the second sub-structure; and the first pin is connected to the third sub-pattern, and the second pin is connected to the fourth sub-pattern.

Optionally, the adhesive is connected to a side surface of the electrode pin and a side surface of the bonding pattern.

Optionally, the planarization pattern includes a first sub-pattern and a second sub-pattern surrounding the first sub-pattern, wherein the bonding pattern and the groove are both disposed on a side, distal from the base substrate, of the first sub-pattern, and the via is disposed between the first sub-pattern and the second sub-pattern; and in a direction perpendicular to the base substrate, a thickness range of the first sub-pattern is from 1.5 microns to 2.5 microns, a thickness range of the second sub-pattern is from 0.5 microns to 1.5 microns, and a depth range of the groove is from 0.2 microns to 0.8 microns;

the bonding pattern and the conductive structure are prepared using a same film layer, and the thin film transistor is a thin film transistor with a top gate structure or a thin film transistor with a bottom gate structure.

In still another aspect, a method for manufacturing an array substrate is provided. The method includes:

forming a thin film transistor on a base substrate;

forming a planarization pattern on the base substrate on which the thin film transistor is formed, the planarization pattern being provided with a via and a groove, the groove being configured to accommodate an adhesive; and forming a conductive bonding pattern on the base substrate on which the planarization pattern is formed, and forming a conductive structure in the via to cause the bonding pattern to be connected to the thin film transistor by the conductive structure, an orthographic projection of the bonding pattern on the base substrate falling outside an orthographic projection of the groove on the base substrate.

Optionally, forming the bonding pattern on the base substrate on which the planarization pattern is formed, and forming the conductive structure in the via include:

forming the bonding pattern on the base substrate on which the planarization pattern is formed by a conductive material and by a patterning process, and forming the conductive structure in the via.

Optionally, the planarization pattern includes a first sub-pattern and a second sub-pattern surrounding the first sub-pattern, wherein the bonding pattern and the groove are both disposed on a side, distal from the base substrate, of the first sub-pattern, and the via is disposed between the first sub-pattern and the second sub-pattern;

in a direction perpendicular to the base substrate, a thickness range of the first sub-pattern is from 1.5 microns to 2.5 microns, a thickness range of the second sub-pattern is from 0.5 microns to 1.5 microns, and a depth range of the groove is from 0.2 microns to 0.8 microns;

the bonding pattern surrounds the groove and includes a third sub-pattern and a fourth sub-pattern that are insulated from each other, the via on the planarization pattern includes a first via and a second via, the conductive structure includes a first sub-structure disposed in the first via, and a second sub-structure disposed in the second via;

wherein the third sub-pattern is connected to a first power supply signal line in the thin film transistor by the first sub-structure, and the fourth sub-pattern is connected to a second power signal line in the thin film transistor by the second sub-structure; and the bonding pattern and the conductive structure are prepared using a same film layer, and the thin film transistor is a thin film transistor with a top gate structure or a thin film transistor with a bottom gate structure In a further aspect, a method for manufacturing a display device is provided. The method includes:

providing the array substrate as described above;

arranging an adhesive in a groove of a planarization pattern, a volume of an adhesive in the groove being greater than a volume of the groove;

arranging a light-emitting unit on a side, distal from a base substrate, of a bonding pattern;

melting the adhesive to cause the molten adhesive to be in contact with the light-emitting unit and the bonding pattern; and solidifying the molten adhesive such that the light-emitting unit is connected to the bonding pattern by the solidified adhesive.

Optionally, the light-emitting unit is a micro light-emitting diode, the micro light-emitting diode including a light-emitting body and an electrode pin protruding from the light-emitting body; and arranging the light-emitting unit on the side, distal from the base substrate, of the bonding pattern includes:

arranging an end, distal from the light-emitting body, of the electrode pin on the side, distal from the base substrate, of the bonding pattern; and melting the adhesive to cause the molten adhesive to be in contact with the light-emitting unit and the bonding pattern includes:

melting the adhesive to cause the molten adhesive to be in contact with a side surface of the electrode pin and a side surface of the bonding pattern.

Optionally, the adhesive has a hot-melting property, and melting the adhesive includes:

melting the adhesive by heating.

Optionally, arranging the adhesive in the groove of the planarization pattern includes:

coating the adhesive into the groove by a screen printing or photoetching process.

Optionally, melting the adhesive to cause the molten adhesive to be in contact with the light-emitting unit and the bonding pattern includes:

melting the adhesive to cause the molten adhesive to be in contact with a side surface of the electrode pin and a side surface of the bonding pattern Optionally, the adhesive has a hot-melting property, and melting the adhesive includes: melting the adhesive by heating;

arranging the adhesive in the groove of the planarization pattern includes: coating the adhesive into the groove by a screen printing or photoetching process;

the planarization pattern includes a first sub-pattern and a second sub-pattern surrounding the first sub-pattern, wherein the bonding pattern and the groove are both disposed on a side, distal from the base substrate, of the first sub-pattern, and the via is disposed between the first sub-pattern and the second sub-pattern; and in a direction perpendicular to the base substrate, a thickness range of the first sub-pattern is from 1.5 microns to 2.5 microns, a thickness range of the second sub-pattern is from 0.5 microns to 1.5 microns, and a depth range of the groove is from 0.2 microns to 0.8 microns;

the bonding pattern surrounds the groove and includes a third sub-pattern and a fourth sub-pattern that are insulated from each other, the via on the planarization pattern includes a first via and a second via, the conductive structure includes a first sub-structure disposed in the first via, and a second sub-structure disposed in the second via; wherein the third sub-pattern is connected to a first power supply signal line in the thin film transistor by the first sub-structure, and the fourth sub-pattern is connected to a second power signal line in the thin film transistor by the second sub-structure; and the light-emitting body includes a first electrode and a second electrode, and the electrode pin includes a first pin connected to the first electrode and a second pin connected to the second electrode, the first pin being connected to the third sub-pattern, and the second pin being connected to the fourth sub-pattern; and the bonding pattern and the conductive structure are prepared using a same film layer, and the thin film transistor is a thin film transistor with a top gate structure or a thin film transistor with a bottom gate structure.

DETAILED DESCRIPTION

For clearer descriptions of the principles, and technical solutions of the present disclosure, specific embodiments of the present disclosure are described hereinafter in detail with reference to the accompanying drawings.

A micro LED display substrate includes an array substrate and a plurality of micro LEDs that are arranged on the array substrate in an array, wherein each micro LED may be considered as a pixel. In the related art, after the micro LED is transferred and placed on the array substrate by a transfer device, the micro LED is required to be welded on the array substrate by a chip bonding process, such that the micro LED display panel is prepared. Since the process of arranging the micro LED on the array substrate is relatively complicated in the related art, the process of preparing the micro LED display panel is relatively complicated.

Figure 1:
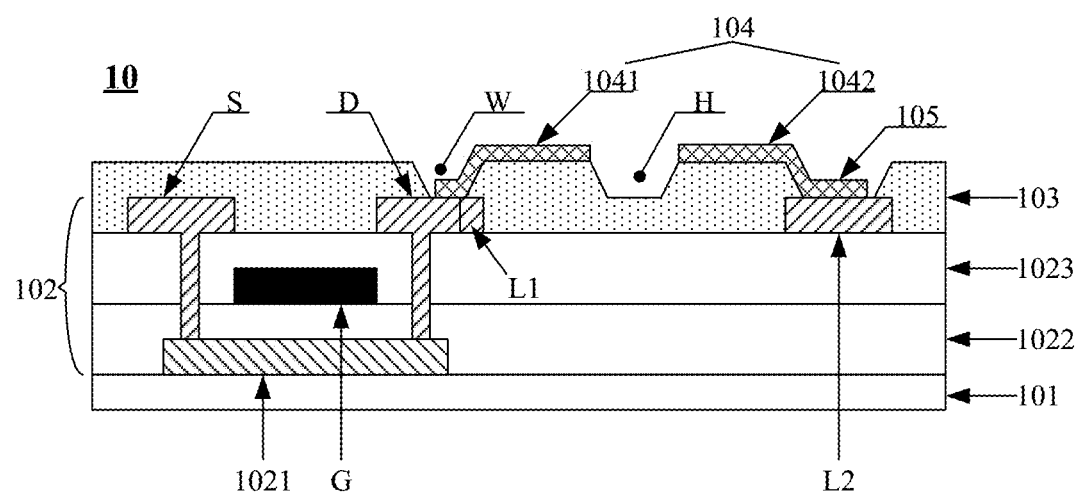
FIG. 1 is a schematic structural diagram of an array substrate according to an embodiment of the present disclosure.

FIG. 1 is a schematic structural diagram of an array substrate 10 according to an embodiment of the present disclosure. As shown in FIG. 1, the array substrate 10 includes: a base substrate 101, and a thin film transistor 102, a planarization pattern 103, a bonding pattern 104, and a conductive structure 105 that are disposed on the base substrate 101.

Referring to FIG. 1, the thin film transistor 102, the planarization pattern 103, and the bonding pattern 104 are laminated in a direction going distally from the base substrate 101. The planarization pattern 103 is provided with a via W and a groove H. A conductive structure 105 is arranged in the via W. The bonding pattern 104 is electrically connected to the thin film transistor 102 by the conductive structure 105. The groove H is configured to accommodate an adhesive. The adhesive in the groove H is configured to fixedly connect a light-emitting unit to the binding structure 104.

Optionally, the array substrate according to the embodiment of the present disclosure may be configured to prepare a micro LED display device (for example, a micro LED display panel).

In conclusion, in the array substrate according to the embodiment of the present disclosure, the planarization pattern is provided with the via and the groove, and the bonding pattern may be connected to the thin film transistor by the conductive structure in the via. Since the groove on the planarization pattern can accommodate the adhesive, a light-emitting unit may be fixedly connected to the bonding pattern by the adhesive in the groove when the light-emitting unit is arranged on the array substrate. Compared with the related art, it is unnecessary to weld the light-emitting unit on the array substrate by a welding process, and thus a setting process of the light-emitting unit is simplified, and a preparation process of the display device may be simplified.

Optionally, the bonding pattern and the conductive structure in the via are arranged in the same layer; wherein a preparation material of each of the bonding pattern and the conductive structure includes at least one of aluminum, neodymium and molybdenum.

It should be noted that the bonding pattern and the conductive structure in the via are arranged in the same layer, that is, the bonding pattern and the conductive structure in the via may be prepared using the same film layer. For example, the bonding pattern and the conductive structure may be prepared by treating the same film layer by a patterning process, thereby simplifying a process for preparing the array substrate.

Optionally, the thin film transistor is a thin film transistor with a top gate structure or a thin film transistor with a bottom gate structure.

In one possible implementation, the thin film transistor is a thin film transistor with a top gate structure. For example, referring to FIG. 1, the thin film transistor 102 includes an active layer pattern 1021, a gate insulating layer 1022, a gate G, a passivation layer 1023, and a source-drain pattern. The source-drain pattern includes a source S and a drain D.

Figure 2:
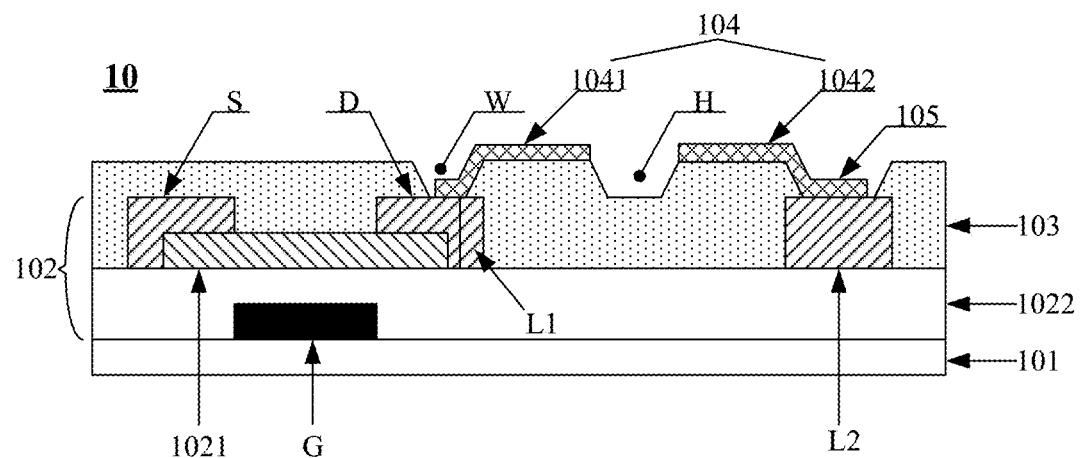
FIG. 2 is a schematic structural diagram of another array substrate according to an embodiment of the present disclosure.

In another possible implementation, the thin film transistor is a thin film transistor with a top gate structure. For example, FIG. 2 is a schematic structural diagram of another array substrate according to an embodiment of the present disclosure. As shown in the FIG. 2, the thin film transistor 102 includes a gate G, a gate insulating layer 1022, an active layer pattern 1021, and a source-drain pattern that are laminated in a direction going distally from the base substrate 101. The source-drain pattern includes a source S and a drain D.

Optionally, the thin film transistor further includes a power signal line. The power signal line, together with the source and the drain, may be prepared in the same layer, that is, the source-drain pattern may further include a power signal line. Optionally, the power signal line includes two types of power signal lines, that is, a Vdd signal line and a Vss signal line. For example, referring to FIG. 1 and FIG. 2, the source-drain pattern includes a source S, a drain D, and a power signal line L (only one power signal line is shown in the drawings).

It should be noted that in the thin film transistor in the array substrate shown in FIG. 1 and FIG. 2, the gate may further be of a two-layer structure, which is not limited by the embodiments of the present disclosure. The accompanying drawings in the embodiments of the present disclosure are only for illustrative description, but not for limitation to the specific structure of the thin film transistor.

Optionally, an orthographic projection of the bonding pattern on the base substrate falls outside an orthographic projection of the groove on the base substrate. That is, no overlapped region is present between the orthographic projection of the bonding pattern on the base substrate and the orthographic projection of the groove on the base substrate. For example, referring to FIG. 1 and FIG. 2, the bonding pattern 104 is arranged to surround the groove H on the planarization pattern 103.

It should be noted that the groove on the planarization pattern is configured to accommodate the adhesive, and a part, disposed in the groove, of a bonding pattern cannot be connected to a light-emitting unit if the bonding pattern is arranged in the groove; therefore, no overlapped region is present between an orthographic projection of the bonding pattern on the base substrate and an orthographic projection of the groove on the planarization pattern on the base substrate, that is, the bonding pattern is not arranged in the groove, and a preparation material may be saved.

Optionally, still referring to FIG. 1 and FIG. 2, the bonding pattern 104 includes a third sub-pattern 1041 and a fourth sub-pattern 1042 that are insulated from each other. The via W includes a first via and a second via. The conductive structure 105 includes a first sub-structure 1051 disposed in the first via, and a second sub-structure 1052 disposed in the second via. The third sub-pattern 1041 is connected to a first power signal line L1 in the thin film transistor 102 by the first sub-structure 1051. The fourth sub-pattern 1042 is connected to a second power signal line L2 in the thin film transistor 102 by the second sub-structure 1052. Optionally, the first power signal line L1 may be connected to the drain D, or the first power signal line L1 may further be connected to the source S, which is not limited by the embodiments of the present disclosure. Optionally, the first power signal line L1 is configured to provide a high-level signal and is a Vdd signal line; and the second power signal line L2 is configured to provide a low-level signal and is a Vss signal line.

Optionally, a preparation material of the gate includes at least one of aluminum (Al), neodymium (Nd), and molybdenum (Mo). A preparation material of the source-drain pattern includes at least one of aluminum, neodymium and molybdenum. A preparation material of the active layer pattern includes at least one of indium gallium zinc oxide (IGZO), low temperature poly-silicon (LTPS), and low temperature polycrystalline oxide (LTPO).

The following embodiment of the present disclosure further illustrates the structure of the array substrate by taking the thin film transistor with the top gate structure in the array substrate as an example.

Figure 3:
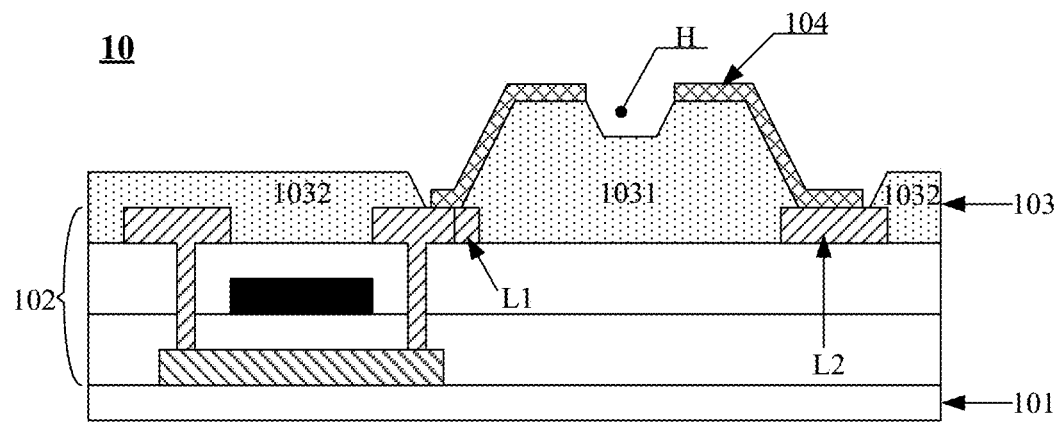
FIG. 3 is a schematic structural diagram of still another array substrate according to an embodiment of the present disclosure.

Optionally, FIG. 3 is a schematic structural diagram of another array substrate according to an embodiment of the present disclosure. As shown in FIG. 3, the planarization pattern 103 includes a first sub-pattern 1031 and a second sub-pattern 1032 surrounding the first sub-pattern 1031. The groove H is arranged on a side, distal from the base substrate 101, of the first sub-pattern 1031. The via W is disposed between the first sub-pattern 1031 and the second sub-pattern 1032. The bonding pattern 104 is disposed on a side, distal from the base substrate 101, of the first sub-pattern 1031. Optionally, in a direction perpendicular to the base substrate 101, a thickness of the first sub-pattern 1031 is greater than a thickness of the second sub-pattern 1032.

It should be noted that the planarization pattern includes a first sub-pattern and a second sub-pattern surrounding the first sub-pattern, and a thickness of the first sub-pattern is greater than a thickness of the second sub-pattern, that is, the planarization pattern has a boss structure. By arranging the bonding pattern on the boss structure, the subsequent alignment setting of the light-emitting unit is facilitated and the setting yield of the light-emitting unit may be increased.

Optionally, a thickness of the source-drain pattern is generally 7500 angstroms, and a thickness of the planarization pattern is greater than the thickness of the source-drain pattern. Optionally, in the direction perpendicular to the base substrate 101, the thickness of the first sub-pattern is in a range of 1.5 microns to 2.5 microns. Optionally, the thickness of the second sub-pattern is in a range of 0.5 microns to 1.5 microns. A depth of the groove is in a range of 0.2 microns to 0.8 microns.

In conclusion, in the array substrate according to the embodiment of the present disclosure, the planarization pattern is provided with the via and the groove, and the bonding pattern can be connected to the thin film transistor by the conductive structure in the via. Since the groove on the planarization pattern can accommodate the adhesive, a light-emitting unit can be fixedly connected to the bonding pattern by the adhesive in the groove when the light-emitting unit is arranged on the array substrate. Compared with the related art, it is unnecessary to weld the light-emitting unit on the array substrate by a welding process, thus a setting process of the light-emitting unit is simplified, and a preparation process of the display device may be simplified.

Figure 4:
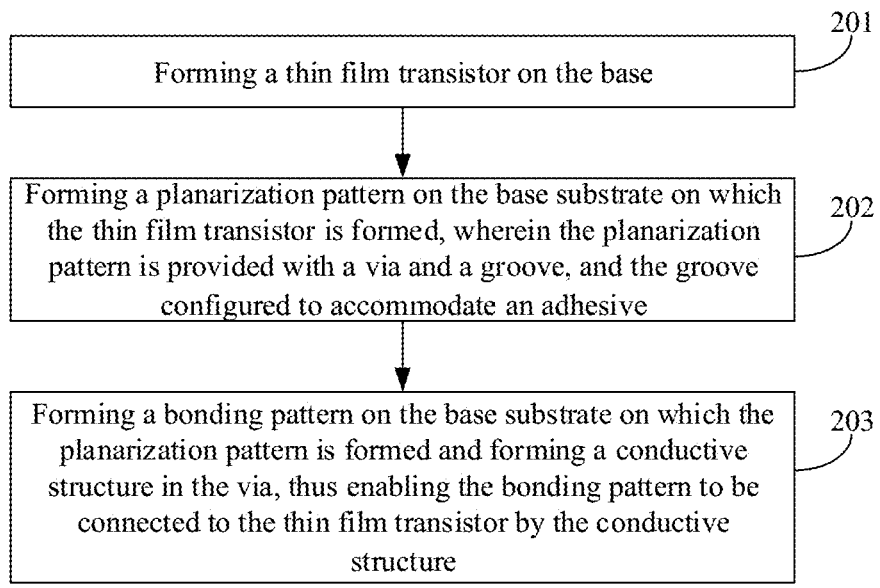
FIG. 4 is a flowchart of a method for manufacturing an array substrate according to an embodiment of the present disclosure.

FIG. 4 is a flowchart of a method for manufacturing an array substrate according to an embodiment of the present disclosure. The method may be applicable to preparation of any array substrate according to the embodiments of the present disclosure. As shown in FIG. 4, the method includes the following steps:

In step 201, a thin film transistor is formed on the base substrate.

Optionally, a preparation method of the base substrate includes at least one of glass, a silicon wafer, quartz and plastic, which is not limited by the embodiment of the present disclosure.

In step 202, a planarization pattern is formed on the base substrate on which the thin film transistor is formed, wherein the planarization pattern is provided with a via and a groove. The groove is configured to accommodate an adhesive.

Optionally, referring to FIG. 3, the planarization pattern 103 includes a first sub-pattern 1031 and a second sub-pattern 1032 surrounding the first sub-pattern 1031, wherein a thickness of the first sub-pattern 1031 is greater than a thickness of the second sub-pattern 1032. The groove H is arranged on a side, distal from the base substrate 101, of the first sub-pattern 1031.

In step 203, a conductive bonding pattern is formed on the base substrate on which the planarization pattern is formed, and a conductive structure is formed in the via to cause the bonding pattern to be connected to the thin film transistor by the conductive structure, wherein an orthographic projection of the bonding pattern on the base substrate falls outside an orthographic projection of the groove on the base substrate.

In one optional embodiment of the present disclosure, when the thin film transistor is a thin film transistor with a top gate structure, step 201 is performed by the following steps:

In step 2011a, an active layer pattern is formed on the base substrate.

Optionally, a preparation material of the active layer pattern includes at least one of IGZO, LTPS, and LTPO. For example, the active layer pattern may be formed on the base substrate by a patterning process. The patterning process includes: photoresist coating, exposure, developing, etching and photoresist stripping.

In step 2012a, a gate insulating layer is formed on the base substrate on which the active layer pattern is formed.

Optionally, a preparation material of the gate insulating layer includes at least one of silicon dioxide, silicon nitride, and aluminum oxide. For example, the gate insulating layer may be formed on the base substrate on which the active layer pattern by deposition.

In step 2013a, a gate is formed on the base substrate on which the gate insulating layer is formed.

Optionally, a preparation material of the gate includes at least one of aluminum, neodymium, and molybdenum. For example, the gate may be formed on the base substrate on which the gate insulating layer is formed by a patterning process.

In step 2014a, a passivation layer is formed on the base substrate on which the gate is formed.

Optionally, a preparation material of the passivation layer includes at least one of silicon dioxide, silicon nitride, and aluminum oxide. For example, the passivation layer may be formed on the base substrate on which the gate is formed by deposition.

In step 2015a, a source-drain pattern is formed on the base substrate on which the passivation layer is formed.

For example, a preparation material of the source-drain pattern includes at least one of aluminum, neodymium, and molybdenum. For example, the source-drain pattern may be formed on the base substrate on which the passivation layer is formed by a patterning process.

In another optional embodiment of the present disclosure, when the thin film transistor is a thin film transistor with a bottom gate structure, step 201 is performed by the following steps:

In step 2011b, a gate is formed on the base substrate.

For material and preparation of the gate, reference may be made to step 2013a, which are not elaborated herein again in this embodiment of the present disclosure.

In step 2012b, a gate insulating layer is formed on the base substrate on which the gate is formed.

For material and preparation of the gate insulating layer, reference may be made to step 2012a, which are not elaborated herein again in this embodiment of the present disclosure.

In step 2013b, an active layer pattern is formed on the base substrate on which the gate insulating layer is formed.

For material and preparation of the active layer pattern, reference may be made to step 2011a, which are not described herein again in this embodiment of the present disclosure.

In step 2014b, a source-drain pattern is formed on the base substrate on which the active layer pattern is formed.

For material and preparation of the source-drain pattern, reference may be made to step 2015a, which are not elaborated herein again in this embodiment of the present disclosure.

Optionally, step 202 is performed by the following steps:

In step 2021, a planarization layer is formed on the base substrate on which the thin film transistor is formed.

Optionally, the planarization layer is formed on the base substrate on which the thin film transistor is formed by a coating process. A thickness of the planarization layer is from 1.5 microns to 2.5 microns. For example, when a thickness of the source-drain pattern in the thin film transistor is 7500 angstroms, the thickness of the planarization layer may be 2 microns. A process for forming the planarization layer with the thickness of 2 microns is relatively mature and stable, and good flat effect of the film layer is achieved, and thus the obtained film layer has high uniformity.

In step 2022, the planarization layer is patterned by a half-tone mask and a patterning process to obtain a planarization pattern.

Optionally, the planarization layer may be prepared by a photosensitive resin material. The planarization layer may be exposed from a side, distal from the base substrate, of the planarization layer by a half-tone mask. The exposed planarization layer is developed to obtain a planarization pattern.

Figure 5:
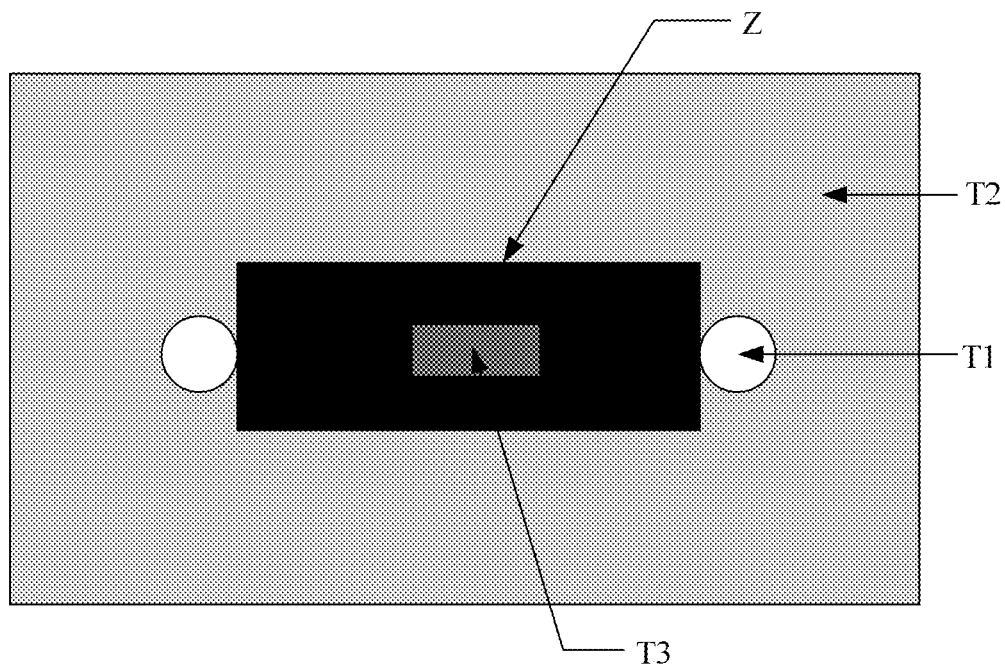
FIG. 5 is a schematic structural diagram of a half-tone mask according to an embodiment of the present disclosure.

For example, FIG. 5 is a schematic structural diagram of a half-tone mask according to an embodiment of the present disclosure. The half-tone mask may be configured to prepare the planarization pattern in the array substrate shown in FIG. 3. When a material of the planarization layer is a positive photosensitive material, as shown in FIG. 5, the half-tone mask may include a first light-transmitting region T1, a second light-transmitting region T2, a third light-transmitting region T3, and a light-shielding region Z of which transmittance sequentially decreases. The light-shielding region Z is an annular region, the third light-transmitting region T3 is a region surrounded by the light-shielding region, and the second light-transmitting region T2 is disposed at the periphery of the light-shielding region Z. Grayscales of the first light-transmitting region T1, the second light-transmitting region T2, the third light-transmitting region T3, and the light-shielding region Z progressively decreases. The shade of a grayscale of the half-tone mask indicates a size of the transmittance, and the darker the grayscale is, the less the transmittance is (black indicates light-tight). That is, the shade of the grayscale of the half-tone mask corresponds to the exposure intensity required by a photoresist layer portion which an orthographic projection of the half-tone mask on a photoresist layer covers, and the darker the grayscale is, the weaker the exposure intensity required by the planarization layer portion is.

It should be noted that the planarization layer is exposed by the half-tone mask shown in FIG. 5 and the exposed planarization layer is developed, and thus the planarization pattern shown in FIG. 3 may be obtained. The first light-transmitting region corresponds to the via, the second light-transmitting region corresponds to the second sub-pattern, the third light-transmitting region corresponds to the groove, and the light-shielding region corresponds to the first sub-pattern. Optionally, in the direction perpendicular to the base substrate, the thickness of the first sub-pattern is in a range of 1.5 microns to 2.5 microns. Optionally, the thickness of the second sub-pattern is in a range of 0.5 microns to 1.5 microns. A depth of the groove is in a range of 0.2 microns to 0.8 microns.

It should be noted that since the thickness of the first sub-pattern is greater than the thickness of the second sub-pattern, that is, the first sub-pattern is protruding from the second sub-pattern, the subsequent alignment of the light-emitting unit is facilitated by arranging the bonding pattern on the boss structure, and the setting yield of the light-emitting unit may be increased.

Optionally, step 203 is performed by the following steps: a bonding pattern is formed on a side, distal from the base substrate, of the first sub-pattern by a conductive material and by a patterning process, and a conductive structure is formed in the via.

Optionally, a preparation material (namely the conductive material) of each of the bonding pattern and the conductive structure includes at least one of aluminum, neodymium and molybdenum. The bonding pattern is formed on a side, distal from the base substrate, of the first sub-pattern by the patterning process, and the conductive structure is formed in the via, and thus a process for preparing the array substrate may be simplified.

In conclusion, in the array substrate prepared by the method for manufacturing the array substrate according to the embodiment of the present disclosure, the planarization pattern is provided with the via and the groove, and the bonding pattern may be connected to the thin film transistor by the conductive structure in the via. Since the groove on the planarization pattern can accommodate the adhesive, a light-emitting unit may be fixedly connected to the bonding pattern by the adhesive in the groove when the light-emitting unit is arranged on the array substrate. Compared with the related art, it is unnecessary to weld the light-emitting unit on the array substrate by a welding process, and thus a setting process of the light-emitting unit is simplified, and a preparation process of the display device may be simplified.

An embodiment of the present disclosure provides a display device. The display device includes a light-emitting unit, an adhesive, and an array substrate according to the embodiments of the present disclosure (the array substrate as shown in any of FIGS. 1 to 3).

Optionally, the display device according to the embodiment of the present disclosure may be a product or part having a display function, such as a display panel, an electronic paper, a mobile phone, a tablet computer, a television, a display, a lap-top computer, a digital photo frame, and a navigator.

Figure 6:
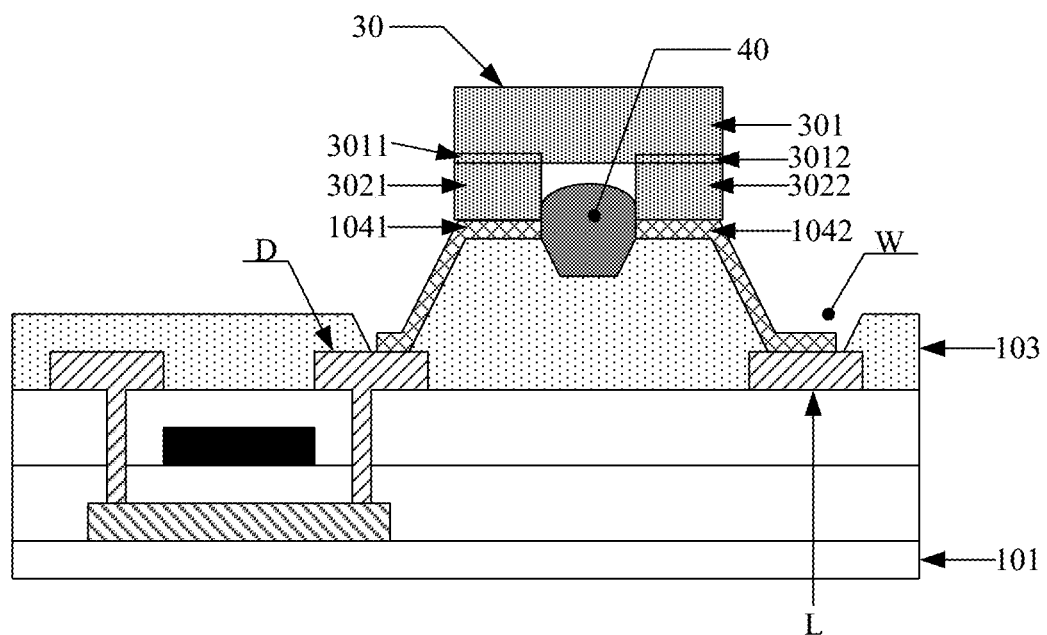
FIG. 6 is a schematic structural diagram of a display device according to an embodiment of the present disclosure.

For example, FIG. 6 is a schematic structural diagram of a display device according to an embodiment of the present disclosure. The display device includes the array substrate shown in FIG. 3. As shown in FIG. 6, the light-emitting unit 30 is disposed on a side, distal from the base substrate 101, of the planarization pattern 103, an adhesive 40 is disposed in the groove of the planarization pattern, and the light-emitting unit 30 is connected to the bonding pattern 104 by the adhesive 40.

In conclusion, the planarization pattern in the array substrate included in the display device according to the embodiment of the present disclosure is provided with the via and the groove, and the bonding pattern may be connected to the thin film transistor by the conductive structure in the via. The light-emitting unit is fixedly connected to the bonding pattern by the adhesive in the groove of the planarization pattern. Compared with the related art, it is unnecessary to weld the light-emitting unit on the array substrate by a welding process, and thus a setting process of the light-emitting unit is simplified, and a preparation process of the display device may be simplified.

Optionally, the light-emitting unit is a micro LED. Still referring to FIG. 6, the micro LED 30 includes a light-emitting body 301 and an electrode pin protruding from the light-emitting body 301. The light-emitting body 301 includes a first electrode 3011 and a second electrode 3012. The electrode pin includes a first pin 3021 connected to the first electrode 3011 and a second pin 3022 connected to the second electrode 3012. The bonding pattern 104 includes a third sub-pattern 1041 and a fourth sub-pattern 1042 that are disposed at the periphery of the groove and are insulated from each other. The via W on the planarization pattern 103 includes a first via and a second via. The third sub-pattern 1041 is connected to a first power signal line (the first power signal line is not shown in the figure) in the thin film transistor 102 by the conductive structure in the first via, and the fourth sub-pattern 1042 is connected to a second power signal line in the thin film transistor 102 by the conductive structure in the second via. An end, distal from the light-emitting body 301, of the first pin 3021 is connected to the third sub-pattern 1041. An end, distal from the light-emitting body 301, of the second pin 3022 is connected to the fourth sub-pattern 1042. When the first electrode 3011 of the light-emitting body is an anode and the second electrode 3012 of the light-emitting body is a cathode, the first power signal line is a Vdd signal line and is configured to provide a high-level signal, and the second power signal line is a Vss signal line and is configured to provide a low-level signal.

Optionally, still referring to FIG. 6, a side surface of the electrode pin is fixedly connected to a side surface of the bonding pattern 104 by the adhesive 40 in the groove. The electrode pin is provided with a surface proximal to the base substrate and a surface distal from the base substrate, and the side surface of the electrode pin is configured to connect these two surfaces. The bonding pattern is also provided with a surface proximal to the base substrate and a surface distal from the base substrate, and the side surface of the bonding pattern is configured to connect these two surfaces.

It should be noted that an end, distal from the light-emitting body, of the electrode pin of the micro LED is in direct contact with the bonding pattern, thus interference of other film layers may be eliminated, mutual lap joint between metals is facilitated, and conductivity is ensured.

It should be noted that the adhesive is an insulating material. Optionally, the adhesive is a hot melt adhesive or a polyimide adhesive.

In conclusion, in the display device according to the embodiment of the present disclosure, the planarization pattern in the array substrate is provided with the via and the groove, and the bonding pattern may be connected to the thin film transistor by the conductive structure in the via. The light-emitting unit is fixedly connected to the bonding pattern by the adhesive in the groove in the planarization pattern. Compared with the related art, it is unnecessary to weld the light-emitting unit on the array substrate by a welding process, and thus a setting process of the light-emitting unit is simplified, and a preparation process of the display device may be simplified.

Figure 7:
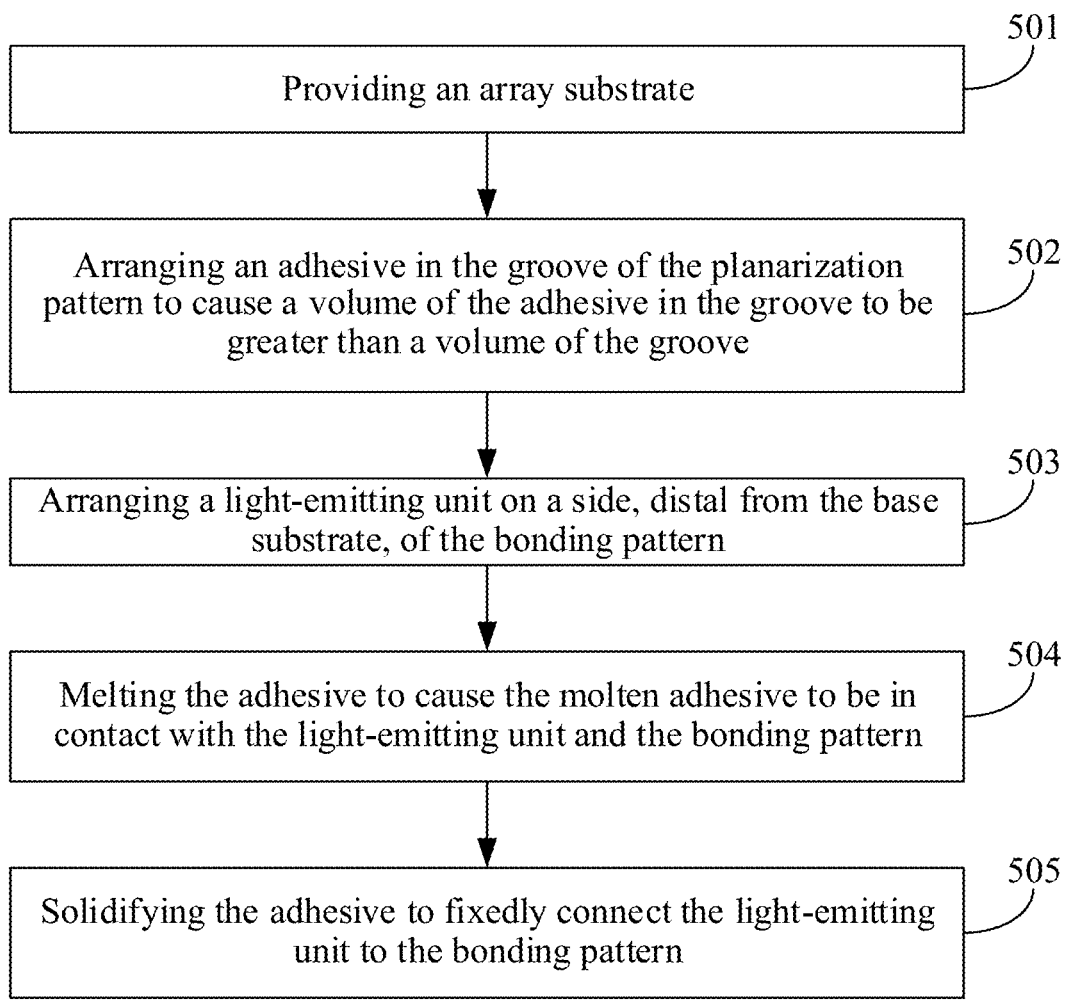
FIG. 7 is a flowchart of a method for manufacturing a display device according to an embodiment of the present disclosure.

FIG. 7 is a flowchart of a method for manufacturing a display device according to an embodiment of the present disclosure. As shown in FIG. 7, the method includes the following steps:

In step 501, a base substrate is provided.

Optionally, the array substrate includes any array substrate according to the embodiments of the present disclosure, for example, the array substrate as shown in any one of FIGS. 1 to 3. The method for manufacturing the array substrate and structures and materials of all the film layers may be referenced to the structure and the manufacturing method of the array substrate, which are not elaborated herein in the embodiment of the present disclosure.

In step 502, an adhesive is arranged in the groove of the planarization pattern to cause a volume of the adhesive in the groove to be greater than a volume of the groove.

Figure 8:
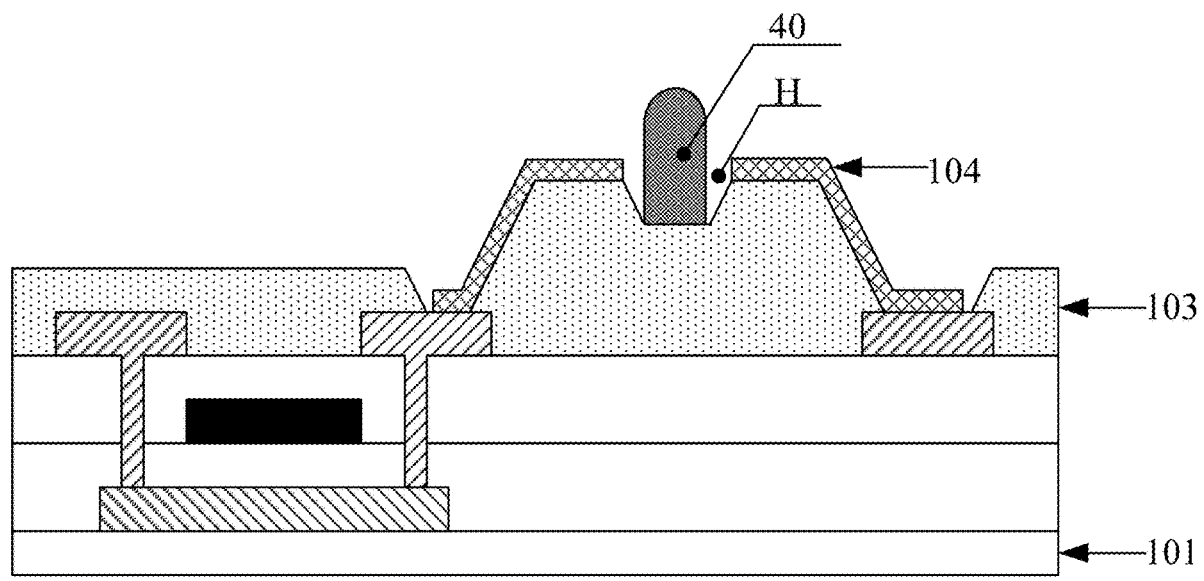
FIG. 8 is a schematic structural diagram of arranging an adhesive in a groove according to an embodiment of the present disclosure.

For example, FIG. 8 is a schematic structural diagram of arranging an adhesive in a groove according to an embodiment of the present disclosure. As shown in FIG. 8, the adhesive 40 of which a height is greater than a depth of the groove H is arranged in the groove H, such that a volume of the adhesive 40 is greater than a volume of the groove H. It should be noted that a position of the adhesive may be fixed when the adhesive is arranged in the groove of the planarization pattern, thereby avoiding influence on contact of the light-emitting unit and the bonding pattern by that the adhesive flows to a surface of the bonding pattern.

Optionally, the adhesive is applied by coating into the groove of the planarization pattern by screen printing or a photoetching process. When the depth of the groove is in a range of 0.2 microns to 0.8 microns, the height of the adhesive may be in a range of 2.5 microns to 4 microns. It should be noted that arranging the adhesive of which the height is greater than the depth of the groove facilitate subsequent fixation of the light-emitting unit. The adhesive may be accurately arranged in the groove by an alignment platform.

Optionally, when the adhesive is applied by coating into the groove of the planarization pattern by the screen printing, a coating thickness of the adhesive may be controlled by adhesive coating quantity of screen printing. When the adhesive is applied by coating into the groove of the planarization pattern by the photoetching process, the coating thickness of the adhesive may be controlled by dispensing quantity of the photoetching process.

It should be noted that the selected adhesive should have a certain viscosity to adhere to the array substrate and the light-emitting unit, and the adhesive is an insulating material. In addition, the adhesive should have flowability under a certain condition. For example, the adhesive is in a flowing state after being heated. Optionally, the adhesive is a hot melt adhesive or a polyimide adhesive.

In step 503, a light-emitting unit is arranged on a side, distal from the base substrate, of the bonding pattern.

Optionally, the light-emitting unit is a micro LED, and the micro LED includes a light-emitting body and an electrode pin protruding from the light-emitting body. Step 503 is implemented by the following steps: an end, distal from the light-emitting body, of the electrode pin is arranged on a side, distal from the base substrate, of the bonding pattern. Since the height of the adhesive is greater than the depth of the groove, a micro LED may be arranged on a side, distal from the base substrate, of the bonding pattern by compression and adhesion. Accurate alignment of the light-emitting unit and the bonding pattern may be achieved by an alignment platform.

It should be noted that an end, distal from the light-emitting body, of the electrode pin of the micro LED is in direct contact with the bonding pattern, thus interference of other film layers may be eliminated, mutual lap joint between metals is facilitated, and conductivity is ensured.

Figure 9:
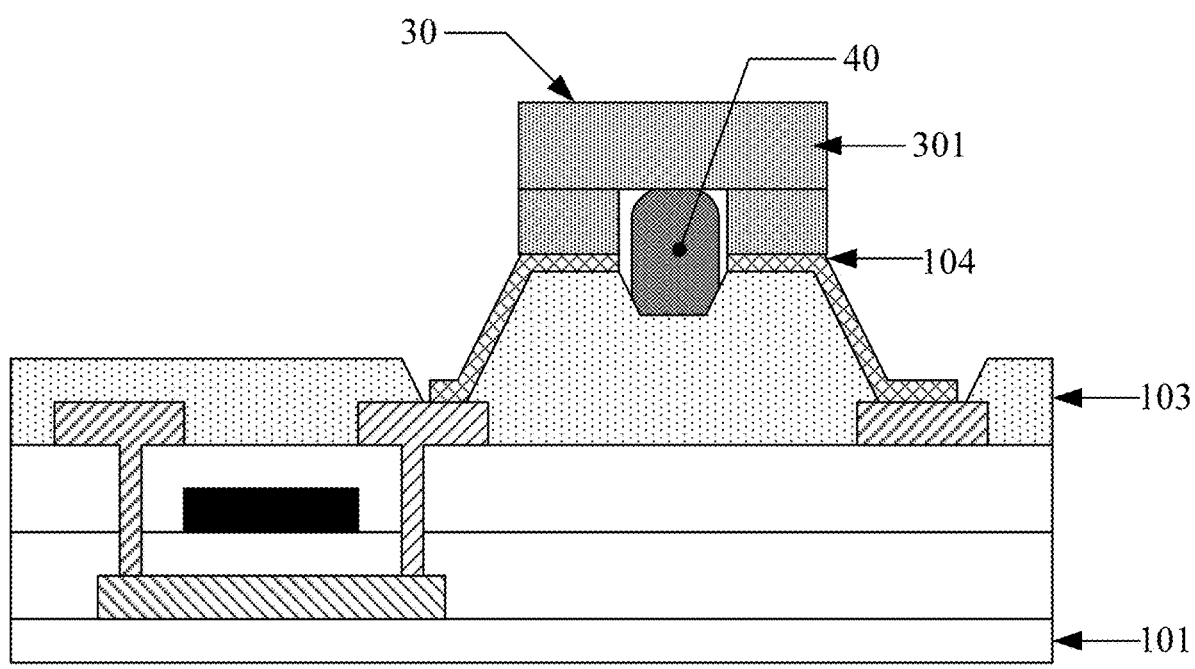
FIG. 9 is a schematic structural diagram of arranging a micro LED on a side, distal from a base substrate, of a bonding pattern according to an embodiment of the present disclosure.

For example, FIG. 9 is a schematic structural diagram of arranging a micro LED on a side, distal from a base substrate, of a bonding pattern according to an embodiment of the present disclosure. As shown in FIG. 9, the light-emitting body 301 in the micro LED 30 may be preliminarily fixed to the array substrate by the adhesive 40, thereby avoiding poor contact caused by dislocation of the electrode pin of the micro LED and the bonding pattern in the subsequent technological process.

In step 504, the adhesive is molten, such that the molten adhesive is in contact with the light-emitting unit and the bonding pattern.

Optionally, step 504 is implemented by the following steps: the adhesive is molten to cause the molten adhesive to be in contact with a side surface of the electrode pin and a side surface of the bonding pattern. Optionally, the adhesive has hot melt property. The adhesive may be molten by heating.

Optionally, in the process of melting the adhesive, a certain pressure is applied to the micro LED disposed on a side, distal from the base substrate, of the bonding pattern to ensure that the electrode pin of the micro LED to be in contact and aligned with the bonding pattern. The adhesive will collapse after being heated, and the collapsed adhesive is in contact with a side surface of the electrode pin and a side surface of the bonding pattern without affecting contact between the electrode pin and the bonding pattern, thus the micro LED may be effectively bound.

In step 505, the molten adhesive is solidified such that the the light-emitting unit is connected to the bonding pattern by the solidified adhesive.

Optionally, after the adhesive is in contact with the side surface of the electrode pin and the side surface of the bonding pattern, the adhesive is cooled and solidified to fixedly connect the light-emitting unit to the bonding pattern. For example, the display device as shown in FIG. 6 may be prepared by the above method.

In conclusion, according to a method for manufacturing the display device according to the embodiment of the present disclosure, the planarization pattern in the array substrate is provided with the via and the groove, and the bonding pattern can be connected to the thin film transistor by the conductive structure in the via. The light-emitting unit is fixedly connected to the bonding pattern by the adhesive in the groove of the planarization pattern. Compared with the related art, it is unnecessary to weld the light-emitting unit on the array substrate by a welding process, thus a setting process of the light-emitting unit is simplified, and a preparation process of the display device may be simplified.

In addition, due to low cost of the adhesive, the preparation cost of the display device may be reduced. By adoption of the method for manufacturing the display panel according to the embodiment of the present disclosure, a plurality of micro LEDs may be aligned with the corresponding bonding pattern respectively, the micro LEDs and the bonding patterns are uniformly heated, and the adhesive is fixedly connected to the corresponding micro LEDs and bonding patterns respectively, such that a huge number of micro LEDs may be transferred and the transfer efficiency of the micro LED may be improved.

It should be noted that an order of the steps of the method for manufacturing the array substrate and the method for manufacturing the display device according to the embodiments of the present disclosure may be properly adjusted, and the steps may also be increased or decreased correspondingly according to the conditions. Any methods that are derived by a person skilled in the art based on the technical content of the present disclosure should be covered within the protection scope of the present disclosure, that are thus not elaborated herein.

The structures in the embodiments of the method are described in details in the related structure side embodiments, which are not illustrated and described in details herein.

The embodiment of the present disclosure further provides a display device. The display device may include a display substrate as shown in FIG. 6.

Optionally, the display device according to the embodiment of the present disclosure may be any products or parts with a display function, such as electronic paper, a mobile phone, a tablet computer, a television, a display, a notebook computer, a digital photo frame and a navigator, or the like.

It should be noted out that in the accompanying drawings, for clarity of the illustration, the dimension of the layers and regions may be scaled up. It may be understood that when an element or layer is described as being "above" another element or layer, the described element or layer may be directly on the other element, or an intermediate layer may be arranged between the described element or layer and the other element. In addition, it may be understood that when an element or layer is described as being "below" another element or layer, the described element or layer may be directly below the other element, or at least one intermediate layer or element may be arranged between the described element or layer and the other element. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals indicate like elements.

In the embodiments of the present disclosure, the terms "first" and "second" are used only for description and shall not be interpreted as indication or implication of relative importance. The term "a plurality of" means two or more than two, unless otherwise specifically defined.

In the embodiments of the present disclosure, the terms "and/or" merely describes the association relationship between the associated objects and indicates that there may be three relationships. For example, A and/or B may indicate three cases where only A exists, A and B exist at the same time, or only B exists. In addition, the character "/" in this specification generally indicates that the related objects are in an "or" relationship.

Described above are merely optional embodiments of the present disclosure, but are not intended to limit the present disclosure. Within the conception and principles of the disclosure, any modifications, equivalent substitutions, improvements, or the like are within the protection scope of the present disclosure.

What is claimed is:

1. An array substrate, comprising: a base substrate, and a thin film transistor, a planarization pattern, a bonding pattern, and a conductive structure that are disposed on the base substrate; wherein
the thin film transistor, the planarization pattern, and the bonding pattern are laminated on the base substrate in a direction going distally from the base substrate;
the planarization pattern is provided with a via and a groove, the conductive structure is arranged in the via, and the bonding pattern is conductive and is electrically connected to the thin film transistor by the conductive structure, wherein an orthographic projection of the bonding pattern on the base substrate falls outside an orthographic projection of the groove on the base substrate, and the groove is configured to accommodate an adhesive and a light-emitting unit is fixedly connected to the bonding pattern by the adhesive; and
the bonding patter is arranged to surround the groove, and the bonding pattern comprises a third sub-pattern and a fourth sub-pattern that are insulated from each other.

2. The array substrate according to claim 1, wherein the planarization pattern comprises a first sub-pattern and a second sub-pattern surrounding the first sub-pattern;
wherein the bonding pattern and the groove are both disposed on a side, distal from the base substrate, of the first sub-pattern, and the via is disposed between the first sub-pattern and the second sub-pattern.

3. The array substrate according to claim 2, wherein in a direction perpendicular to the base substrate, a thickness of the first sub-pattern is greater than a thickness of the second sub-pattern.

4. The array substrate according to claim 2, wherein in a direction perpendicular to the base substrate, a thickness range of the first sub-pattern is from 1.5 microns to 2.5 microns, a thickness range of the second sub-pattern is from 0.5 microns to 1.5 microns, and a depth range of the groove is from 0.2 microns to 0.8 microns.

5. The array substrate according to claim 1, wherein the via comprises a first via and a second via; and the conductive structure comprises a first sub-structure disposed in the first via, and a second sub-structure disposed in the second via;
wherein the third sub-pattern is connected to a first power signal line in the thin film transistor by the first sub-structure, and the second sub-pattern is connected to a second power signal line in the thin film transistor by the second sub-structure.

6. The array substrate according to claim 1, wherein the bonding pattern and the conductive structure are prepared using a same film layer.

7. The array substrate according to claim 1, wherein the thin film transistor is a thin film transistor with a top gate structure or a thin film transistor with a bottom gate structure.

8. The array substrate according to claim 3, wherein in the direction perpendicular to the base substrate, a thickness range of the first sub-pattern is from 1.5 microns to 2.5 microns, a thickness range of the second sub-pattern is from 0.5 microns to 1.5 microns, and a depth range of the groove is from 0.2 microns to 0.8 microns;
the via comprises a first via and a second via, and the conductive structure comprises a first sub-structure disposed in the first via, and a second sub-structure disposed in the second via;
wherein the third sub-pattern is connected to a first power signal line in the thin film transistor by the first sub-structure, and the second sub-pattern is connected to a second power signal line in the thin film transistor by the second sub-structure; and
the bonding pattern and the conductive structure are prepared using a same film layer, and the thin film transistor is a thin film transistor with a top gate structure or a thin film transistor with a bottom gate structure.

9. A display device, comprising a light-emitting unit, an adhesive, and the array substrate as defined in claim 1;
wherein the light-emitting unit is disposed on a side, distal from a base substrate, of a bonding pattern, and the adhesive is disposed in a groove of a planarization groove.

10. The display device according to claim 9, wherein the light-emitting unit is a micro light-emitting diode, the micro light-emitting diode comprising a light-emitting body and an electrode pin protruding from the light-emitting body, the light-emitting body comprising a first electrode and a second electrode, and the electrode pin comprising a first pin connected to the first electrode and a second pin connected to the second electrode;

the via on the planarization pattern comprises a first via and a second via, the conductive structure comprises a first sub-structure disposed in the first via, and a second sub-structure disposed in the second via; wherein the third sub-pattern is connected to a first power supply signal line in the thin film transistor by the first sub-structure, and the fourth sub-pattern is connected to a second power signal line in the thin film transistor by the second sub-structure; and the first pin is connected to the third sub-pattern, and the second pin is connected to the fourth sub-pattern.

11. The display device according to claim 10, wherein the adhesive is connected to a side surface of the electrode pin and a side surface of the bonding pattern.

12. A method for manufacturing a display device, comprising:

providing an array substrate as defined in claim 1;

arranging an adhesive in a groove of a planarization pattern, a volume of the adhesive in the groove being greater than a volume of the groove;

arranging the light-emitting unit on a side, distal from a base substrate, of a bonding pattern;

melting the adhesive to cause the molten adhesive to be in contact with the light-emitting unit and the bonding pattern; and solidifying the molten adhesive such that the light-emitting unit is connected to the bonding pattern by the solidified adhesive.

13. The method according to claim 12, wherein the light-emitting unit is a micro light-emitting diode, the micro light-emitting diode comprising a light-emitting body and an electrode pin protruding from the light-emitting body; and arranging the light-emitting unit on the side, distal from the base substrate, of the bonding pattern comprises:

arranging an end, distal from the light-emitting body, of the electrode pin on the side, distal from the base substrate, of the bonding pattern.

14. The display device according to claim 11, wherein the planarization pattern comprises a first sub-pattern and a second sub-pattern surrounding the first sub-pattern, wherein the bonding pattern and the groove are both disposed on a side, distal from the base substrate, of the first sub-pattern, and the via is disposed between the first sub-pattern and the second sub-pattern; and in a direction perpendicular to the base substrate, a thickness range of the first sub-pattern is from 1.5 microns to 2.5 microns, a thickness range of the second sub-pattern is from 0.5 microns to 1.5 microns, and a depth range of the groove is from 0.2 microns to 0.8 microns;

the bonding pattern and the conductive structure are prepared using a same film layer, and the thin film transistor is a thin film transistor with a top gate structure or a thin film transistor with a bottom gate structure.

15. The method according to claim 13, wherein melting the adhesive to cause the molten adhesive to be in contact with the light-emitting unit and the bonding pattern comprises:

melting the adhesive to cause the molten adhesive to be in contact with a side surface of the electrode pin and a side surface of the bonding pattern.

16. The method according to claim 15, wherein the adhesive has a hot-melting property, and melting the adhesive comprises:

melting the adhesive by heating;

arranging the adhesive in the groove of the planarization pattern comprises:

coating the adhesive into the groove by a screen printing or photoetching process;

the planarization pattern comprises a first sub-pattern and a second sub-pattern surrounding the first sub-pattern, wherein the bonding pattern and the groove are both disposed on a side, distal from the base substrate, of the first sub-pattern, and the via is disposed between the first sub-pattern and the second sub-pattern; and in a direction perpendicular to the base substrate, a thickness range of the first sub-pattern is from 1.5 microns to 2.5 microns, a thickness range of the second sub-pattern is from 0.5 microns to 1.5 microns, and a depth range of the groove is from 0.2 microns to 0.8 microns;

the via on the planarization pattern comprises a first via and a second via, the conductive structure comprises a first sub-structure disposed in the first via, and a second sub-structure disposed in the second via; wherein the third sub-pattern is connected to a first power supply signal line in the thin film transistor by the first sub-structure, and the fourth sub-pattern is connected to a second power signal line in the thin film transistor by the second sub-structure; and the light-emitting body comprises a first electrode and a second electrode, and the electrode pin comprises a first pin connected to the first electrode and a second pin connected to the second electrode, the first pin being connected to the third sub-pattern, and the second pin being connected to the fourth sub-pattern; and the bonding pattern and the conductive structure are prepared using a same film layer, and the thin film transistor is a thin film transistor with a top gate structure or a thin film transistor with a bottom gate structure.

17. A method for manufacturing an array substrate, comprising:

forming a thin film transistor on a base substrate;

forming a planarization pattern on the base substrate on which the thin film transistor is formed, the planarization pattern being provided with a via and a groove, the groove being configured to accommodate an adhesive; and forming a conductive bonding pattern on the base substrate on which the planarization pattern is formed, and forming a conductive structure in the via to cause the bonding pattern to be connected to the thin film transistor by the conductive structure, an orthographic projection of the bonding pattern on the base substrate falling outside an orthographic projection of the groove on the base substrate; and wherein a light-emitting unit is fixedly connected to the bonding pattern by the adhesive, the bonding patter is arranged to surround the groove, and the bonding pattern comprises a third sub-pattern and a fourth sub-pattern that are insulated from each other.

18. The method according to claim 17, wherein forming the conductive bonding pattern on the base substrate on which the planarization pattern is formed, and forming the conductive structure in the via comprise:

forming the bonding pattern and the conductive structure on the base substrate on which the planarization pattern is formed by a patterning process.

19. The method according to claim 18, wherein the planarization pattern comprises a first sub-pattern and a second sub-pattern surrounding the first sub-pattern, wherein the bonding pattern and the groove are both disposed on a side, distal from the base substrate, of the first sub-pattern, and the via is disposed between the first sub-pattern and the second sub-pattern;
- in a direction perpendicular to the base substrate, a thickness range of the first sub-pattern is from 1.5 microns to 2.5 microns, a thickness range of the second sub-pattern is from 0.5 microns to 1.5 microns, and a depth range of the groove is from 0.2 microns to 0.8 microns;
- the via on the planarization pattern comprises a first via and a second via, the conductive structure comprises a first sub-structure disposed in the first via, and a second sub-structure disposed in the second via;
- wherein the third sub-pattern is connected to a first power supply signal line in the thin film transistor by the first sub-structure, and the fourth sub-pattern is connected to a second power signal line in the thin film transistor by the second sub-structure; and
- the bonding pattern and the conductive structure are prepared using a same film layer, and the thin film transistor is a thin film transistor with a top gate structure or a thin film transistor with a bottom gate structure.

* * * * *